(12) United States Patent
Kim et al.

(10) Patent No.: US 10,022,946 B2
(45) Date of Patent: Jul. 17, 2018

(54) TRANSFER FILM FOR ATTACHING PROTECTION FILM TO FLAT PANEL DISPLAY AND METHOD FOR MANUFACTURING THE FLAT PANEL DISPLAY USING THE SAME

(71) Applicant: LG DISPLAY CO., LTD., Seoul (KR)

(72) Inventors: Jongmoo Kim, Seoul (KR); Chanwoo Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 135 days.

(21) Appl. No.: 14/609,150

(22) Filed: Jan. 29, 2015

(65) Prior Publication Data

US 2015/0136315 A1 May 21, 2015

Related U.S. Application Data

(62) Division of application No. 13/718,857, filed on Dec. 18, 2012, now abandoned.

(30) Foreign Application Priority Data

Apr. 16, 2012 (KR) .................. 10-2012-0039234

(51) Int. Cl.
*B32B 37/18* (2006.01)
*B32B 38/10* (2006.01)
*B32B 37/00* (2006.01)
*B32B 7/06* (2006.01)
*G02F 1/13* (2006.01)
*B32B 3/30* (2006.01)

(52) U.S. Cl.
CPC ............. *B32B 37/025* (2013.01); *B32B 3/30* (2013.01); *B32B 7/06* (2013.01); *B32B 37/18* (2013.01);

(Continued)

(58) Field of Classification Search
CPC ... B32B 2457/20; B32B 37/025; B32B 37/18; B32B 38/10; B32B 3/30; B32B 7/06;
(Continued)

(56) References Cited

U.S. PATENT DOCUMENTS 5,156,941 A * 10/1992 Fujita ............... G06K 19/06046
427/162
6,582,789 B1 * 6/2003 Sumi ...................... C09J 7/0285
428/1.1

(Continued)

FOREIGN PATENT DOCUMENTS

DE   102004014784 B3   9/2005
JP   2008-145918 A     6/2006
KR   10-2008-0073224 A 8/2008

*Primary Examiner* — Mark A Osele
(74) *Attorney, Agent, or Firm* — Birch, Stewart, Kolasch & Birch, LLP

(57) ABSTRACT

The present disclosure relates to a transfer film for attaching protection film to flat panel display and method for manufacturing the flat panel display using the same. The present disclosure suggests a transfer film comprising: a lower film; and a protection film temporarily attached on the lower film and including a base film and an adhesion layer disposed on an upper surface of the base film. In the present disclosure, the flat panel display can be encapsulated using a transfer film having a protection film temporarily attached on a flexible lower film, so that it is possible to perfectly encapsulate the flat panel display with the protection film without any foreign material such as air bubble.

10 Claims, 7 Drawing Sheets

(52) U.S. Cl.
CPC ............... B32B 38/10 (2013.01); G02F 1/13 (2013.01); *B32B 2457/20* (2013.01); *Y10T 428/14* (2015.01); *Y10T 428/24802* (2015.01); *Y10T 428/24942* (2015.01); *Y10T 428/2848* (2015.01)

(58) Field of Classification Search
CPC .. G02F 1/13; Y10T 428/14; Y10T 428/24802; Y10T 428/24942; Y10T 428/2848
USPC ................................... 156/249; 428/1.1–1.62
See application file for complete search history.

(56) References Cited

U.S. PATENT DOCUMENTS

| | | |
|---|---|---|
| 6,777,055 B2 | 8/2004 | Janssen et al. |
| 7,323,235 B2 | 1/2008 | Vaughn |
| 7,592,057 B2 | 9/2009 | Dronzek, Jr. et al. |
| 8,101,256 B1 | 1/2012 | Cowan |
| 2001/0035645 A1 | 11/2001 | Carides et al. |
| 2001/0036645 A1 | 11/2001 | Carides et al. |
| 2002/0110651 A1* | 8/2002 | Suzushi ................... B44F 1/10 428/1.5 |
| 2004/0142118 A1* | 7/2004 | Takechi ............ H01L 29/78603 428/1.6 |
| 2007/0020445 A1* | 1/2007 | Liu ....................... B81C 99/008 428/195.1 |
| 2007/0046560 A1* | 3/2007 | Neugebauer ............ G09F 3/204 345/1.1 |
| 2007/0175582 A1 | 8/2007 | Baek et al. |
| 2010/0175823 A1* | 7/2010 | Muko .................... B32B 33/00 156/247 |
| 2010/0283943 A1* | 11/2010 | Kimura ............... B32B 38/1841 349/96 |
| 2012/0075221 A1* | 3/2012 | Yasuda ................... B32B 37/02 345/173 |

\* cited by examiner

TRANSFER FILM FOR ATTACHING PROTECTION FILM TO FLAT PANEL DISPLAY AND METHOD FOR MANUFACTURING THE FLAT PANEL DISPLAY USING THE SAME

This application is a Divisional Application of co-pending U.S. application Ser. No. 13/718,857 filed on Dec. 18, 2012, which claims the priority benefit of Korean Patent Application No. 10-2012-0039234 filed on Apr. 16, 2012, all of which are incorporated herein by reference for all purposes as if fully set forth herein.

BACKGROUND OF THE INVENTION

Field of the Invention

The present disclosure relates to a transfer film for attaching protection film to flat panel display and method for manufacturing the flat panel display using the same. Especially, the present disclosure relates to a transfer film having protection films temporarily to prevent an organic light emitting diode display device (OLED) from moisture and a method for manufacturing the OLED using the same.

Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP) and the electroluminescence display device (or ED).

The electroluminescence display device is categorized in the inorganic light emitting diode display device and the organic light emitting diode display device according to the luminescence material. As a self-emitting display device, the electroluminescence display device has the merits those the response speed is very fast, the brightness is very high and the view angle is large. FIG. 1 illustrates the structure of the organic light emitting diode according to the related art. Referring to FIG. 1, the organic light emitting diode comprises the organic light emitting material layer, and the cathode and the anode which are facing each other with the organic light emitting material layer therebetween. The organic light emitting material layer comprises the hole injection layer HIL, the hole transport layer HTL, the emission layer EML, the electron transport layer ETL and the electron injection layer EIL.

The organic light emitting diode radiates the lights due to the energy from the excition formed at the excitation state in which the hole and the electron are recombined at the emission layer EML. The organic light emitting display device represents the video data by controlling the light brightness from the emission layer EML of the organic light emitting diode.

The organic light emitting diode display (or OLED) using the organic light emitting diode can be categorized in the passive matrix type organic light emitting diode display (or PMOLED) and the active matrix type organic light emitting diode display (or AMOLED). Furthermore, according to the direction of the emitted light, it can be categorized in the top emission type and the bottom emission type.

By representing any video/image in the natural color, the organic light emitting diode display is currently coming into the lime light, and widely applied in various field including the portable personal information devices such as cellular phone, smart phone or PDAs. The OLED is the self luminescence display having the high responding speed less than 1 ms and the low power consumption, for representing natural full color images/videos. Furthermore, it has wide view angle covering near 180 degree, and it is best device for display regardless of diagonal size. Its manufacturing method is very simple, based on the low temperature process and the conventional semiconductor processing technologies.

However, the OLED is very weak from oxygen and moisture. In order to ensure the reliability of the OLED property, until now, the glass substrate having a getter is used for encapsulation of the organic light emitting material. As the requirement and needs for the thin and flexible display are increased, the glass substrate may be exchanged by film type encapsulation as the protecting film for the OLED panel.

Hereinafter, referring to FIGS. 2A and 2B, we will explain how to attaching the protection film to the OLED according to the related art. FIGS. 2A and 2B are perspective views illustrating the processes for attaching the protection film to the organic light emitting diode display panel.

As shown in FIG. 2A, in the related art, after placing the protection film FF on the transferring substrate PT at each pattern using a metal jig MM, the protection film FF is transferred to the organic light emitting diode display panel.

In order to maintain the shape, the metal jig MM is made of rigid metal material. The metal jig MM has a plurality of pattern hole HO at which each protection film FF is located. As well known to ordinary skilled person, a plurality of the OLED panels are arrayed in a matrix pattern, on one large mother substrate MG, each protection film FF is attached on each organic light emitting diode display panel, and then a plurality of the unit OLED displays are completed by cutting the mother substrate MG.

The metal jig MM is combined with the transferring substrate PT. Each protection film FF is located at each pattern hole HO formed at the metal jig MM. At this time, the protection film FF is located as the adhesive surface is facing upward. The adhesive may be the thermal hardening epoxy resin.

Referring to FIG. 2B, a mother substrate MG having a plurality of organic light emitting diode display panels OLED is located on the metal jig MM. By aligning each organic light emitting diode display panel OLED with each protection film FF relatively, the mother substrate MG is placed on the metal jig MM. After that, keeping the chamber temperature to 70° C. to melt the adhesive, the protection films FF are attached on the organic light emitting diode display panels OLED. At the same time, keeping the chamber in vacuum condition, the protection films FF and the organic light emitting diode display panels OLED should be firmly closed to each other. After that, increasing the temperature of the chamber up to 100° C. for hardening the adhesive, the protection films FF are permanently attached on the organic light emitting diode display panels OLED.

Like this, as the method for attaching the protection film to the organic light emitting diode display panel OLED according to the related art is conducted under vacuum condition, the vacuum facility is required. Furthermore, for hardening the adhesive, the oven system is also required. Especially, aligning the substrate with the metal jig and conducting processes in oven and vacuum chamber through a manual processes, the method according to the related art is not proper to apply In-line type facility for mass production. That is, the related art cannot ensure enough yields for establishing the mass production system.

In addition, as the protection film is attached to the organic light emitting diode display panel under vacuum condition, when the air is not perfectly out, air bubble may be formed so that the protection film may not be attached correctly. Especially, as the rigid large substrate should be attached to the transferring substrate having rigid structure, it is hard to completely eliminate the air bubble between them so that the final product may have defects on representing images/videos.

SUMMARY OF THE INVENTION

In order to overcome the above mentioned drawbacks, the purpose of the present disclosure is to suggest a transfer film for attaching a protection film to a flat panel display and a method for manufacturing a flat panel display using the same transfer film. Another purpose of the present disclosure is to a transfer film applied to a In-Line type facility for attaching the transfer film to a flat panel display without air bubble there-between and a method for manufacturing a flat panel display using the same transfer film.

In order to accomplish the above purpose, the present disclosure suggests a transfer film comprising: a lower film; and a protection film temporarily attached on the lower film and including a base film and an adhesion layer disposed on an upper surface of the base film.

The protection film further includes a relief film attached on an upper surface of the adhesion layer, and further comprising an upper film including a flexible relief base facing the relief film of the protection film and a strong adhesion layer disposed on a surface of the flexible relief base configured to attach with the relief film.

The lower film includes: a flexible transfer base; and a weak adhesion layer disposed on a surface of the flexible transfer base configured to attach with the base film of the lower film.

The protection film is temporarily attached on the lower film in a manner that a plurality of unit protection films is disposed in a matrix array.

The each unit protection film comprises a unit upper film including: a unit flexible relief base facing the relief film of the each unit protection film; and a unit strong adhesion layer disposed on a surface of the unit flexible relief base configured to attach with the relief film.

Furthermore, the present disclosure suggests a method for manufacturing a flat panel display comprising: forming a display panel; forming a transfer film including a protection film having a lower film, a base film temporarily attached on the lower film, and an adhesion layer disposed on an upper surface of the base film; attaching the transfer film on an upper surface of the display panel by adhering the protection film on the display panel; and removing the lower film of the transfer film to encapsulate the display panel by the protection film.

The forming the transfer film includes: preparing the lower film having a flexible transfer base and a weak adhesion layer disposed on one side of the flexible transfer base; preparing the protection film having the base film, the adhesion layer disposed on the upper surface of the base film, and a relief film disposed on the adhesion layer; preparing an upper film having a flexible relief base and a strong adhesion layer disposed on one surface of the flexible relief base; temporarily attaching the base film of the protection film on the weak adhesion layer of the lower film; adhering the strong adhesion layer of the upper film on the relief film of the protection film; selectively patterning the upper film and the protection film to have same size corresponding to the display panel; and removing the upper film to peel off the relief film of the protection film.

The attaching the transfer film on the upper surface of the display panel is conducted from one end side to the other end side by a roller.

The method further comprising: attaching a circular polarization film on the protection film; and attaching a cover film on the display panel having the circular polarization film with an optical adhesive.

The forming the display panel includes: depositing a sacrifice layer on a rigid substrate; depositing a flexible layer on the rigid substrate; and forming display elements on the flexible layer, and wherein the method, after attaching the cover film, further comprises: separating the flexible layer from the rigid substrate by removing the sacrifice layer; and attaching a back panel at a rear surface of the flexible layer.

In the present disclosure, the flat panel display can be encapsulated using a transfer film having a protection film temporarily attached on a flexible lower film. Like this, as a flexible transfer film is used, it is possible to perfectly encapsulate the flat panel display with the protection film without any foreign material such as air bubble. Therefore, the present disclosure can suggest a method for manufacturing a flat panel display in which the encapsulating property is enhanced and the display property is progressed. Further, by preparing the transfer film with low price materials, the price for manufacturing the flat panel display can be reduced and the processes can be simplified.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
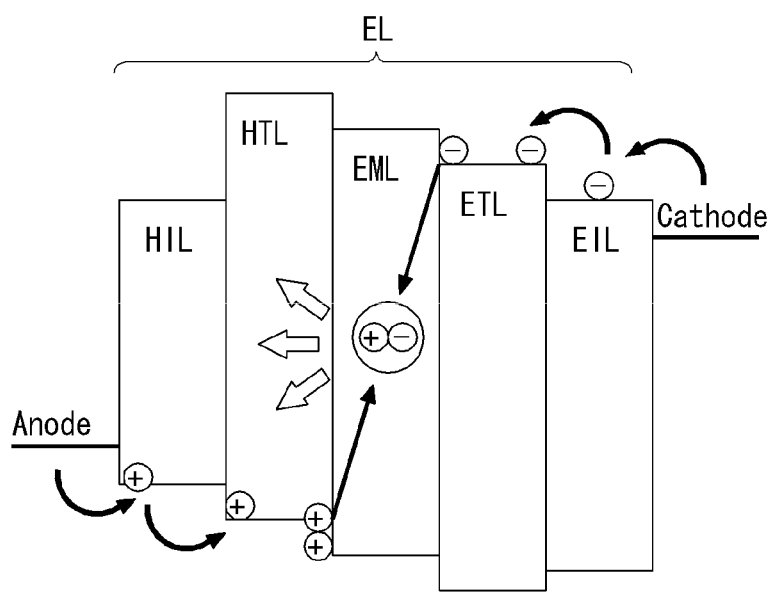
FIG. 1 illustrates the structure of the organic light emitting diode according to the related art.
Figure 2A:
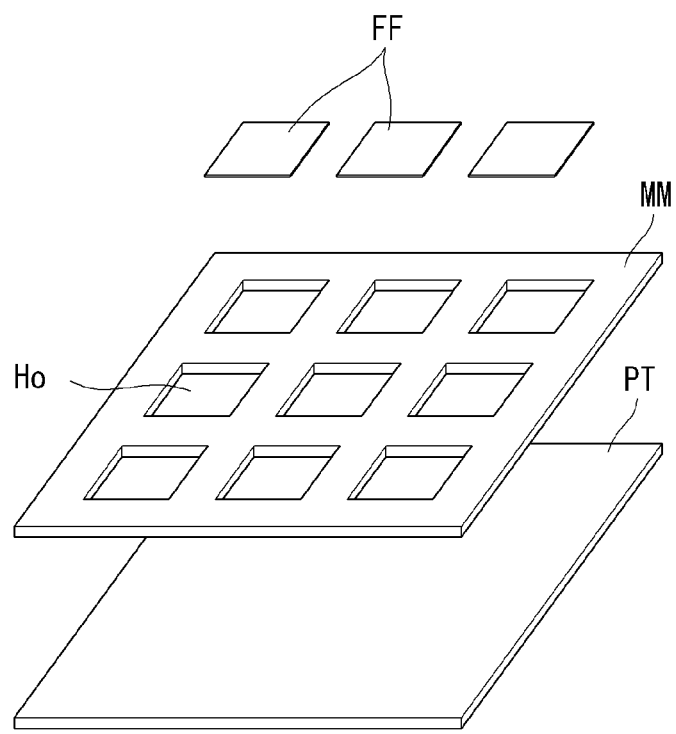
FIGS. 2A and 2B are perspective views illustrating the processes for attaching the protection film to the organic light emitting diode display panel.
Figure 2B:
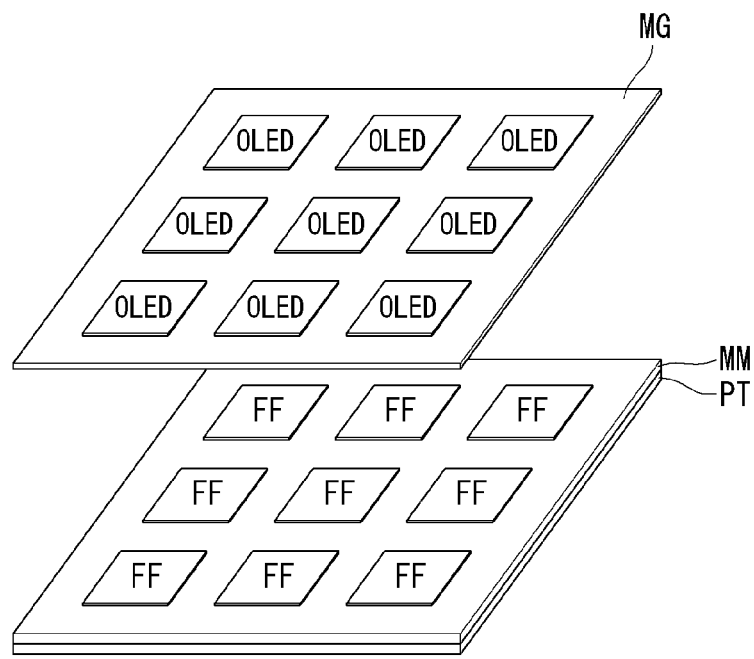

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Hereinafter, referring to FIGS. 3A to 3D, we will explain about a transfer film for temporarily attaching a protection film of a flat display panel according to the present disclosure. FIGS. 3A to 3D are cross-sectional views illustrating a method for manufacturing a transfer film configured to attach a protection film to an organic light emitting diode display panel, according to the present disclosure.

Figure 3A:
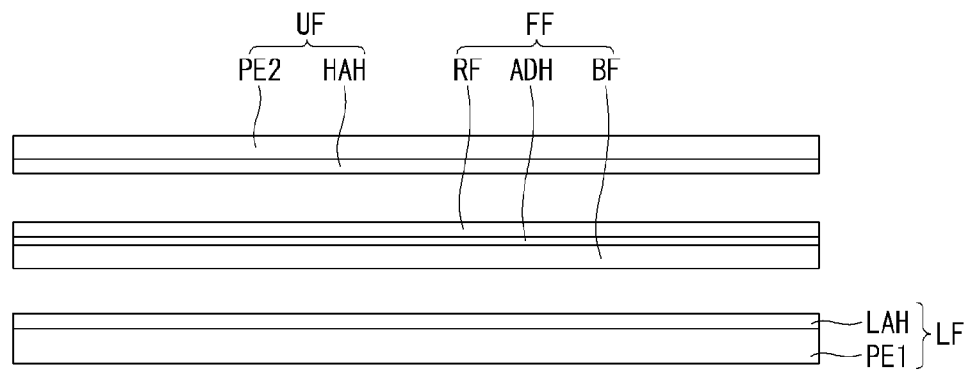
FIGS. 3A to 3D are cross-sectional views illustrating a method for manufacturing a transfer film configured to attach a protection film to an organic light emitting diode display panel, according to the present disclosure.

At first, referring to FIG. 3A, a transfer film for attaching a protection film of a flat display panel according to the present disclosure comprises a protection film FF, a lower film LF, and an upper film UF. The protection film FF includes a base film BF, an adhesion layer ADH deposited on the whole surface of one side of the base film BF, and a relief film RF temporarily stick onto the adhesion layer ADH. The lower film LF includes a transfer base PE1, and a weak adhesion layer LAH deposited on the whole surface of one side of the transfer base PEE And, the upper film UF includes a relief base PE2, and a strong adhesion layer HAH deposited on the whole surface of one side of the relief base PE2.

Figure 3B:
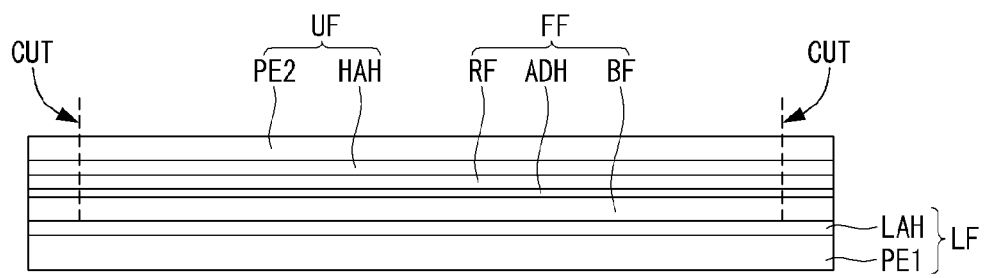

Referring to FIG. 3B, the rear side of the base film BF of the protection film FF which does not have the adhesion layer ADH is attached with the weak adhesion layer LAH of the lower film LF. Further, the relief film RF of the protection film FF is attached to the strong adhesion layer HAH of the upper film UF. Along to the cutting line CUT, the upper film UF and the protection film FF are selectively cut off. In order to cut the upper film UF and the protection film FF selectively in the multi layer stacked structure of the lower film LF, the protection film FF and the upper film UP, it is preferable to use the Thomson Platen Die Cutting method. As a result, the remained part of the upper film UF and the protection film FF after cutting off may be same size with the attaching area on the organic light emitting diode display panel OLED.

Figure 3C:
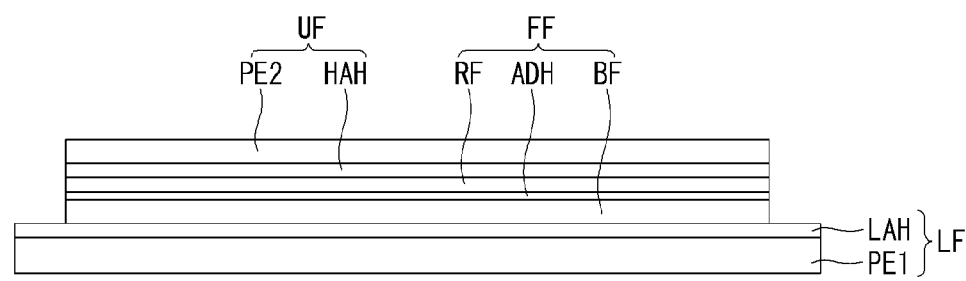

As a result, the transfer film is formed as shown in FIG. 3C. In this condition, the upper film UF is not yet removed from the transfer film, so that the relief film RF is still attached on the protection film FF. As the transfer film and the organic light emitting diode display panel are prepared respectively, until the protection film FF is attached on the display panel, the upper film UF should be attached on the transfer film to protect the adhesion layer ADH from being contaminating by ambient materials. The size of each protection film FF should be same with the size of each organic light emitting diode display panel.

Figure 3D:
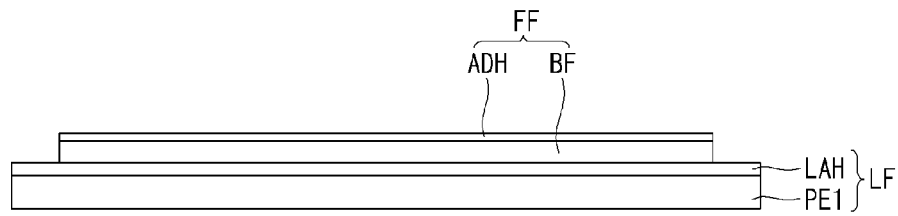

Referring to FIG. 3D, just before attaching the protection film FF to the organic light emitting diode display panel, the upper film UF should be removed. At this time, the relief film RF is also removed (peeled off) because it is firmly adhered to the upper film UF by the strong adhesion layer HAH. That is, the adhesive strength of the strong adhesion layer HAH should be stronger than the adhesive strength of the relief film RF on the adhesion layer ADH of the protection film FF to remove the relief film RF simultaneously when removing the upper film UF. In the interim, the adhesive strength of the weak adhesion layer LAH temporarily attaching the base film BF of the protection film FF to the lower film PE1 should be stronger than the adhesive strength of the relief film RF temporarily attached to the adhesion layer ADH of the protection film FF, so that the protection film FF cannot be detached from the lower film LF by the force of removing the relief film RF.

The strong adhesion layer HAH should be removed with the relief film RF when the upper film PE1 is removed, so it should have strong adhesive strength. On the contrary, the weak adhesion layer LAH should have strong adhesive strength enough not to detach the base film BF of the protection film FF from the lower film LF when the relief film RF is removed. In addition, the lower film LF should be removed after transferring the protection film FF to the organic light emitting diode display panel, so that the weak adhesion layer LAH should have weaker adhesive strength than the adhesive strength of the adhesion layer ADH after the thermal hardening process.

Hereinafter, referring to FIGS. 4A to 4E, we will explain a method for manufacturing the organic light emitting diode display by attaching the protection film to the organic light emitting diode display panel, using the transfer film for attaching the protection film of the flat display panel as shown in FIG. 3D according to the present disclosure. FIGS. 4A to 4E are cross-sectional views illustrating the method for attaching the protection film and method for manufacturing a flat panel display using the transfer film for attaching the protection film of the flat panel display according to the present disclosure.

Figure 4A:
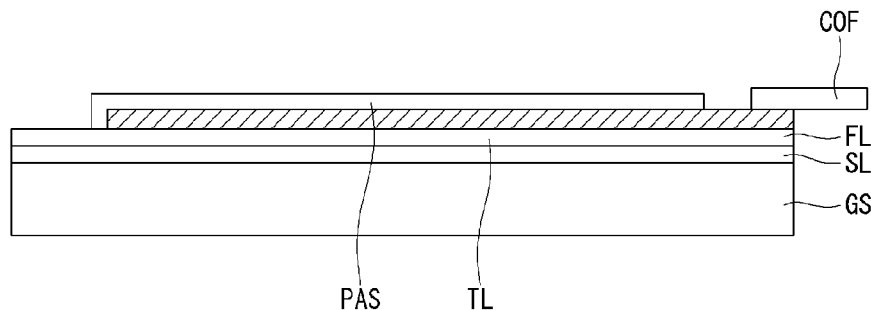
FIGS. 4A to 4E are cross-sectional views illustrating the method for attaching the protection film and method for manufacturing a flat panel display using the transfer film for attaching the protection film of the flat panel display according to the present disclosure.

At first, referring to FIG. 4A, we will explain about the process for preparing an organic light emitting diode display panel. The organic light emitting diode display panel comprises a plurality of pixel electrode arrayed in a matrix pattern on a substrate, a thin film transistor disposed at one corner of each pixel electrode for driving the pixel electrode, and an organic light emitting diode stacked on the pixel electrode.

A base substrate GS having enough strength is prepared. Here, the enough strength means that the base substrate GS is not bent, distorted or/and deformed to maintain the flatness so that the elements formed on the base substrate GS are not affected during the manufacturing processes including loading and unloading processes between the various facilities and the depositing process.

A sacrifice layer SL is deposited on the whole surface of the base substrate GS. The sacrifice layer SL is a temporarily layer for dividing the element layer from the base substrate GS for completing a flexible display. The sacrifice layer SL may include amorphous silicon. Radiating the laser beam to crystallizing the amorphous silicon, the base substrate GS can be removed from the element layers formed thereon.

On the sacrifice layer SL, a flexible layer FL used for a flexible substrate of the flexible display is deposited. The flexible layer FL may include organic materials such as the polyimide. On the flexible layer FL, a display element layer TL is formed. The display element layer TL includes a display area for representing the images/videos and a pad area extending from the display area. For example, the display element layer TL may be include a plurality of thin film transistors and pixel areas disposed in a matrix manner, and an organic light emitting diode driven by the thin film transistor at each pixel area.

On the display element layer TL, a passivation layer PAS is deposited to protect the display element from the out-gas and moisture. The display element layer TL is formed within some area of the flexible layer FL. In FIG. 4A, the display element layer TL is expanded to the right end side. This end portions (pad area) may include the pads and link lines extended from the display elements. Therefore, the display elements of the display element layer TL are covered by the passivation layer PAS, but the pad area is exposed. Like this, on the exposed pad area of one side (right side) of the display panel, a film type printed circuit board (COF) having driver ICs for driving the display elements is disposed, as shown in FIG. 4A.

The organic light emitting diode display panel is prepared. After further comprising a protection element and an optical element on the organic light emitting diode display panel, the final organic light emitting diode display can be completed.

Figure 4B:
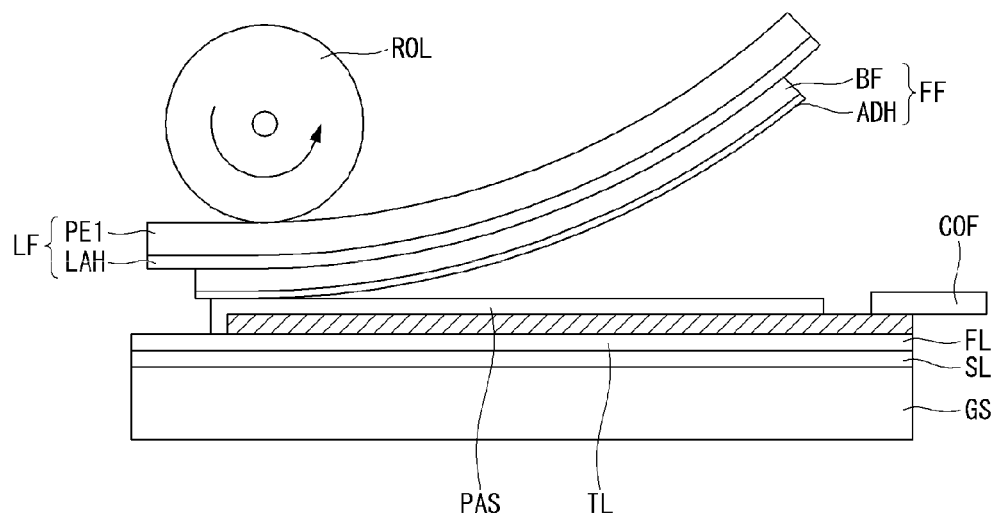

For example, in order to reinforce the protection property and strength of the passivation layer PAS, a barrier film BF may cover the display element layer TL over the passivation layer PAS to encapsulate the display elements. As shown in FIG. 4B, turning over the transfer film in which the protection film FF is attached on the lower film LF as shown in FIG. 3D, the adhesion layer ADH of the protection film FF is attached on the passivation layer PAS of the organic light emitting diode display panel. At this time, in order to prevent any air bubble from occurring between the protection film FF and the passivation layer PAS, one end side of the protection film FF is firstly contacted one end side of the passivation layer PAS, after that using a roller ROL, the other parts of the protection film FF is completely attached by rolling and pressing to the other end side of the roller ROL. The transfer film according to the present disclosure has the protection film FF temporarily attached on the flexible lower film LF, so that it is possible to attach to the organic light emitting diode display panel using the roller ROL.

Figure 4C:
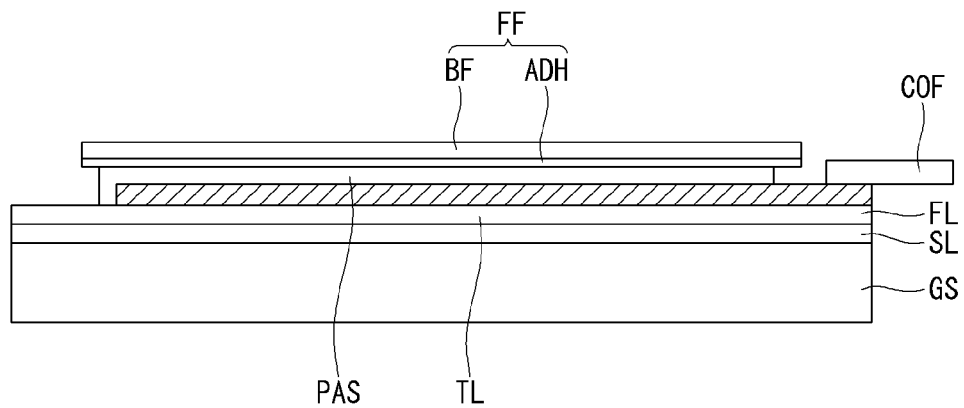

After the transfer film having the protection film FF temporarily attached to the lower film LF is joined on the passivation layer PAS by attaching the protection film FF, by thermal treatment, the adhesion layer ADH permanently combines the protection film FF with the passivation layer PAS. For example, when the adhesion layer ADH includes a thermal hardening adhesive material, by thermally hardening the adhesion layer ADH in the thermal treating chamber with 100° C. and more, the protection film FF can be firmly and permanently adhered to the passivation layer PAS. After the adhesion layer ADH is hardened completely, the lower film LF and the weak adhesion layer LAH are removed from the base film BF of the protection film FF. As a result, as shown in FIG. 4C, the protection film FF can encapsulate the passivation layer PAS over the organic light emitting diode display panel.

Figure 4D:
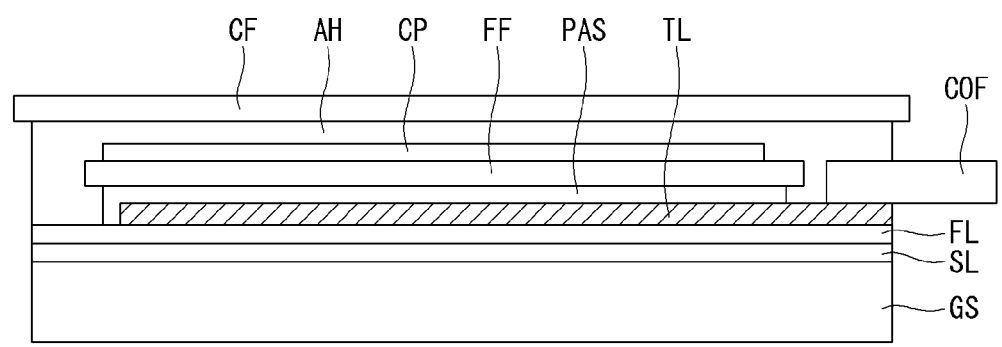
Figure 4E:
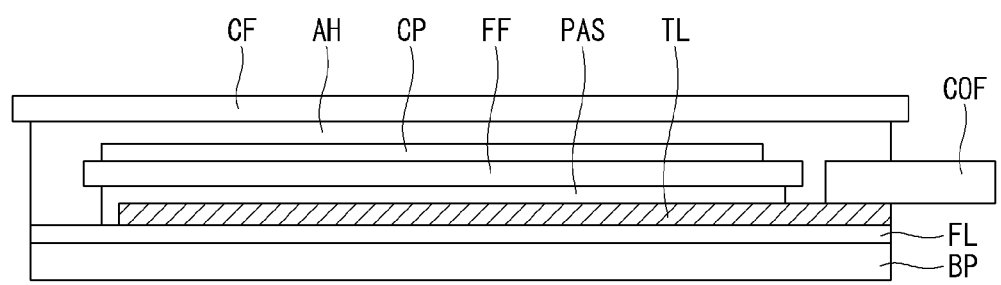

After that, as shown in FIG. 4D, a circular polarization film CP is attached on the protection film FF. At this time, the circular polarization film CP should be disposed as covering the display element area radiating the light for representing image/video. To complete the organic light emitting diode display, a cover film CF is attached on the circular polarization film CP. When attaching the cover film CF, the flatness should be maintained. Therefore, it is preferable to use an organic optical adhesion layer AH having excellent flatness and optical properties for attaching the cover film CF covering the whole surface of the base substrate GS. More detail, in the present disclosure, the light emitting direction is the upper side where the circular polarization film CF is attached. Therefore, the organic optical adhesion layer AH should be optically transparent material and an organic material for keeping the flatness of the surface of the display panel. In addition, the organic optical adhesion layer AH preferably includes a optical bond material for hardening by the ultraviolet light. For example, the organic optical adhesion layer AH may include acrylate esters, acrylate urethanes, mercaptons, and photoinitiator materials.

Completing the display after attaching the cover film CF, this display panel still has the base substrate GS, the rigid substrate, so it is a non-flexible display. A laser having 532 nm wavelength is radiated into the sacrifice layer SL from the outside of the base substrate GS. Especially, the laser beam should be uniformly radiated and scanned over the whole surface of the sacrifice layer SL. As a result, the amorphous silicon of the sacrifice layer SL is changed (i.e. crystallized) so that the base substrate GS can be departed or separated from the flexible film FL.

Further, as shown in 4E, a back panel BP having sufficient flexibility is attached on the flexible layer FL to complete the flexible organic light emitting diode display. The back panel BP may have much thicker thickness than that of the flexible layer FL to protect the flexible layer FL and other elements formed on the flexible layer FL, but it has enough thin thickness to maintain the flexibility of the display.

On the contrary, when the back panel BP is a rigid substrate but thin thickness, non-flexible organic light emitting diode display can be manufactured. Furthermore, when the back panel BP has much thinner thickness than the base substrate GS, non-flexible but ultra thin organic light emitting diode display can be manufactured.

The above mentioned preferred embodiment of the present disclosure is the explanation for the manufacturing process of single organic light emitting diode display by attaching a protection film to single organic light emitting diode display panel. In the interim, by forming a plurality of organic light emitting diode display panels on one mother board and attaching a plurality of protection films on one large lower film, each protection film can be attached on each organic light emitting diode display panel, respectively. In this case, removing the large lower film, conducting additional processes on the organic light emitting diode display panels, and then dividing each organic light emitting diode display panels, a plurality of organic light emitting diode displays can be completed.

Figure 5:
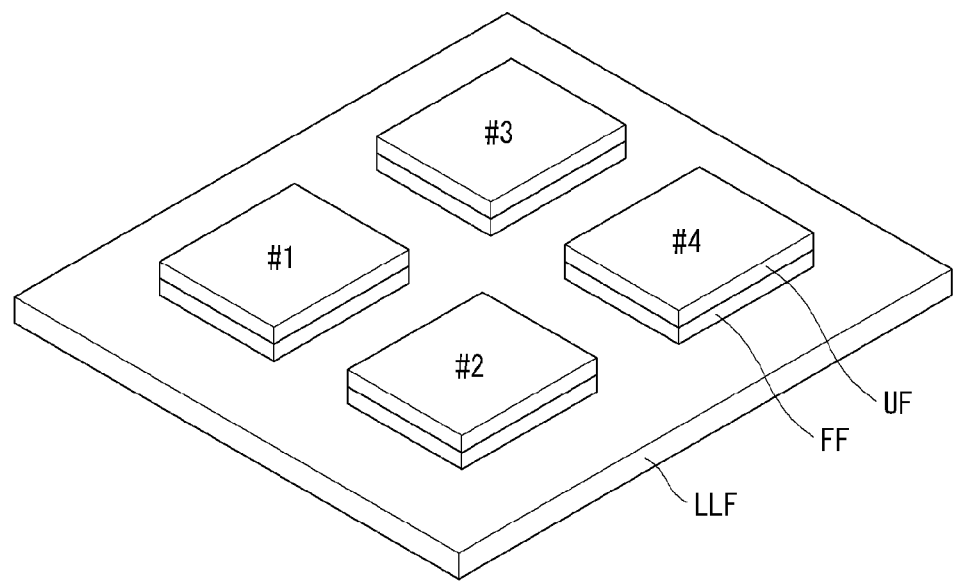
FIG. 5 is a perspective view illustrating that four protection films (#1 to #4) are disposed in a matrix pattern on one large lower film.

Hereinafter, referring to FIGS. 5 and 6, we will explain about a method for attaching the protection film using a large area transfer film after a plurality of organic light emitting diode display panels on one large mother rigid substrate. FIG. 5 is a perspective view illustrating that four protection films (#1 to #4) are disposed in a matrix pattern on one large lower film. In this case, as shown in FIG. 3B, after stacking the protection film FF and an upper film UF on the large area lower film LLF, and cutting the upper film UF and the protection film FF, the four protection films (#1 to #4) are disposed as shown in FIG. 5.

Figure 6:
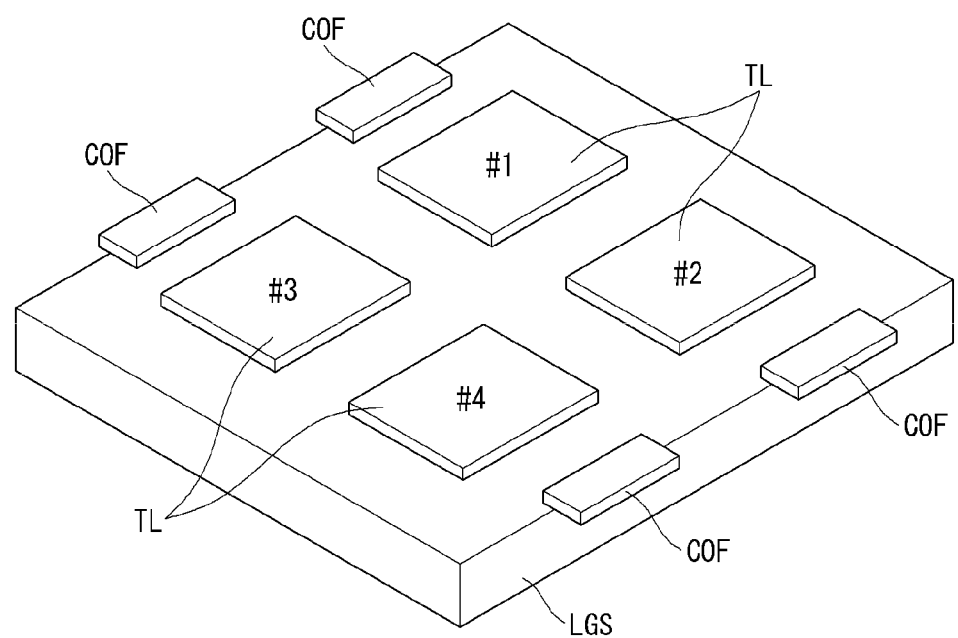
FIG. 6 is a perspective view illustrating that four organic light emitting diode display panels (#1 to #4) are disposed on one large rigid mother substrate.

Further, FIG. 6 is a perspective view illustrating that four organic light emitting diode display panels (#1 to #4) are disposed on one large rigid mother substrate LGS. The single organic light emitting diode display panel OLED comprises a display element layer TL and a film type printed circuit board COF disposed at one side of the display element layer TL.

Turning over the transfer film having #1 to #4 protection films FF disposed on the large area lower film LLF as shown in FIG. 5, placing the protection films FF on the #1 to #4 display element layers TL, respectively, and pressing and attaching them, the large area lower film LLF is removed. After that, each protection film FF can be attached on each organic light emitting diode display panel disposed on one large mother substrate LGS, and other post processes, if required, are conducted, then flexible or non-flexible organic light emitting diode display can be completed.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A manufacturing method of a flat panel display, the method comprising:
   forming a display panel;
   providing a lower film including a flexible transfer base and a first adhesion layer having a first adhesive strength;
   providing a protection film including a base film, a second adhesion layer, and a relief film disposed on the second adhesion layer, the second adhesion layer having a second adhesive strength weaker than the first adhesive strength;
   providing an upper film including a flexible relief base and a third adhesion layer having a third adhesive strength stronger than the second adhesive strength;
   forming a transfer film by using the upper film to remove the relief film from the protection film so that the transfer film includes the lower film, the base film temporarily attached to the lower film, and the second adhesion layer disposed on the base film;
   attaching the transfer film to the display panel by adhering the second adhesion layer of the transfer film to the display panel; and
   removing the lower film of the transfer film from the base film of the transfer film to encapsulate the display panel by the base film of the transfer film,
   wherein the first adhesive strength is to the base film, and the second adhesive strength and the third adhesive strength are to the relief film.

2. The method according to claim 1, wherein the forming the transfer film includes:
   temporarily attaching the base film of the protection film on the first adhesion layer of the lower film;
   adhering the third adhesion layer of the upper film on the relief film of the protection film;
   selectively patterning the upper film and the protection film to have a same size corresponding to the display panel; and
   removing the upper film and the relief film of the protection film, wherein the second adhesive strength of the second adhesion layer of the protection film is weaker than the third adhesive strength of the third adhesion layer of the upper film, such that the relief film is peeled off from the protection film when the upper film is removed.

3. The method according to claim 1, wherein the attaching the transfer film to the display panel is conducted from one end side to the other end side by a roller.

4. The method according to claim 1, further comprising:
   attaching a circular polarization film to the base film of the transfer film; and
   attaching a cover film on the display panel having the circular polarization film with an optical adhesive.

5. The method according to claim 4, wherein the forming the display panel includes:
   depositing a sacrifice layer on a rigid substrate;
   depositing a flexible layer on the rigid substrate; and
   forming display elements on the flexible layer, and
   wherein, after attaching the cover film, the method further comprises:
   separating the flexible layer from the rigid substrate by removing the sacrifice layer; and
   attaching a back panel at a rear surface of the flexible layer.

6. The method according to claim 5, wherein the sacrifice layer includes amorphous silicon deposited on an entire surface of the rigid substrate.

7. The method according to claim 1, further comprising:
   thermally hardening the second adhesion layer of the transfer film in a chamber, prior to removing the lower film of the transfer film from the base film of the transfer film,
   wherein, after the thermally hardening the second adhesion layer, the second adhesive strength of the second adhesion layer of the transfer film is stronger than the first adhesive strength of the first adhesion layer of the lower film, such that the lower film of the transfer film is removed from the base film of the transfer film.

8. The method according to claim 7, wherein the second adhesion layer of the transfer film includes a thermal hardening adhesive material.

9. A manufacturing method of a flat panel display, the method comprising:
   forming a display panel;
   forming a transfer film including a lower film and a protection film, the protection film including a base film temporarily attached to the lower film, and an intermediate adhesion layer disposed on an upper surface of the base film;
   attaching the transfer film to an upper surface of the display panel by adhering the intermediate adhesion layer of the protection film on the display panel; and
   removing the lower film of the transfer film from the protection film to encapsulate the display panel by the protection film,
   wherein the forming the transfer film includes:
   preparing the lower film having a flexible transfer base and a lower adhesion layer disposed on one side of the flexible transfer base;
   preparing the protection film having the base film, the intermediate adhesion layer disposed on the upper surface of the base film, and a relief film disposed on the intermediate adhesion layer;
   preparing an upper film having a flexible relief base and an upper adhesion layer disposed on one surface of the flexible relief base;
   temporarily attaching the base film of the protection film to the lower adhesion layer of the lower film;
   adhering the upper adhesion layer of the upper film on the relief film of the protection film;
   selectively patterning the upper film and the protection film to have same size corresponding to the display panel; and
   removing the upper film entirely to peel off the relief film of the protection film, and
   wherein the upper adhesion layer of the upper film has an adhesive strength to the relief film stronger than the adhesive strength to the relief film of the intermediate adhesion layer of the protection film, such that the relief film is peeled off from the protection film when the upper film is removed.

10. A manufacturing method of a flat panel display, the method comprising:
    forming a display panel;
    providing a lower film including a flexible transfer base and a first adhesion layer having a first adhesive strength;

providing a protection film including a base film, a second adhesion layer, and a relief film disposed on the second adhesion layer, the adhesion layer having a second adhesive strength weaker than the first adhesive strength;

providing an upper film including a flexible relief base and a third adhesion layer having a third adhesive strength stronger than the second adhesive strength;

forming a transfer film to include the lower film, the base film temporarily attached to the lower film, and the second adhesion layer disposed on the base film by:
    temporarily attaching the base film of the protection film on the first adhesion layer of the lower film;
    adhering the third adhesion layer of the upper film on the relief film of the protection film;
    selectively patterning the upper film and the protection film to have a same size corresponding to the display panel; and
    removing the upper film and the relief film of the protection film, wherein the second adhesive strength of the second adhesion layer of the protection film is weaker than the third adhesive strength of the third adhesion layer of the upper film, such that the relief film is peeled off from the protection film when the upper film is removed;

attaching the transfer film to the display panel by adhering the second adhesion layer of the transfer film to the display panel; and removing the lower film of the transfer film from the base film of the transfer film to encapsulate the display panel by the base film of the transfer film, wherein the first adhesive strength is to the base film, and the second adhesive strength and the third adhesive strength are to the relief film.

* * * * *